(12) United States Patent
Nitsche et al.

(10) Patent No.: US 8,212,431 B2
(45) Date of Patent: *Jul. 3, 2012

(54) SAFETY SWITCHING APPARATUS

(75) Inventors: Thomas Nitsche, Esslingen (DE); Boris Kaufmann, Aichtal (DE); Johannes Hopp, Esslingen (DE); Rolf Dickhoff, Kirchheim (DE)

(73) Assignee: Pilz GmbH & Co. KG, Ostfildern (DE)

( * ) Notice: Subject to any disclaimer, the term of this patent is extended or adjusted under 35 U.S.C. 154(b) by 11 days.

This patent is subject to a terminal disclaimer.

(21) Appl. No.: 13/027,570

(22) Filed: Feb. 15, 2011

(65) Prior Publication Data
US 2011/0133574 A1    Jun. 9, 2011

Related U.S. Application Data

(63) Continuation of application No. 12/194,782, filed on Aug. 20, 2008, which is a continuation of application No. PCT/EP2007/000765, filed on Jan. 30, 2007.

(30) Foreign Application Priority Data

Mar. 1, 2006   (DE) .......................... 10 2006 010 106

(51) Int. Cl.
*H02H 1/00*   (2006.01)
(52) U.S. Cl. ......... 307/326; 307/112; 307/116; 307/131
(58) Field of Classification Search ................... 307/112, 307/116, 131, 326
See application file for complete search history.

(56) References Cited

U.S. PATENT DOCUMENTS

| | | | |
|---|---|---|---|
| 5,828,971 A * | 10/1998 | Diekhans et al. | ............... 701/41 |
| 6,051,894 A | 4/2000 | Shimogama | |
| 6,198,612 B1 | 3/2001 | Männer | |
| 7,208,899 B2 | 4/2007 | Hashimoto et al. | |
| 2008/0067876 A1 | 3/2008 | Nitsche et al. | |
| 2008/0067877 A1 | 3/2008 | Nitsche | |
| 2008/0278875 A1 | 11/2008 | Bauer et al. | |

FOREIGN PATENT DOCUMENTS

| | | | |
|---|---|---|---|
| DE | 43 37 665 C1 | 10/1994 | |
| DE | 44 23 704 C1 | 10/1995 | |
| DE | 198 05 722 A1 | 9/1999 | |
| DE | 10 2005 055 325 B3 | 4/2007 | |

OTHER PUBLICATIONS 19 820-04 PNOZ X8P Operating Instructions; Dec. 2004; pp. 1-8.
DIN EN 954-1; Safety-related parts of control systems; 1996; 33 pages.

* cited by examiner

*Primary Examiner* — Adi Amrany
(74) *Attorney, Agent, or Firm* — Harness, Dickey & Pierce, P.L.C.

(57) ABSTRACT

A safety switching apparatus for the failsafe disconnection of an electrical load has a first and a second terminal for supplying a first and a second signal from a signaling device, such as an emergency-off button. The safety switching apparatus also has a first and a second switching element which together produce a redundant output switching signal for disconnecting the load. The first switching element has a first control circuit to which the first signal is supplied. The second switching element has a second control circuit to which the second signal is supplied. The safety switching apparatus further has circuitry providing a first current path, an alternative second current path and at least one further switching element. The at least one further switching element is designed to select either the first or the second current path, depending on a polarity of the second signal, in order to route the second signal to the second control circuit.

28 Claims, 3 Drawing Sheets

SAFETY SWITCHING APPARATUS

CROSS REFERENCES TO RELATED APPLICATIONS

This application is a continuation of U.S. application Ser. No. 12/194,782, filed Aug. 20, 2008, which is a continuation of international patent application PCT/EP2007/000765 filed on Jan. 30, 2007 designating the U.S., which international patent application has been published in German language and claims priority from German patent application DE 10 2006 010 106.5 filed on Mar. 1, 2006. The entire contents of these prior applications are incorporated herein by reference.

BACKGROUND OF THE INVENTION

The present invention relates to a safety switching apparatus for failsafe disconnection of an electrical load, such as an electrical motor or electromagnetic valve in an automatically operated installation.

Safety switching apparatuses in terms of the present invention are typically used to shut-down a dangerous machine or installation in a failsafe manner when this is necessary in order to protect people. The safety switching apparatuses typically monitor signals generated from or via emergency-off buttons, guard door switches, light barriers, light grids or other safety signaling devices. The safety switching apparatuses are designed to interrupt a power supply path to the monitored machine or installation as a function of or depending on these signals.

Depending on a machine's or an installation's potential for danger, there are different safety categories stipulating what requirements a safety switching apparatus needs to meet for a particular use. For example, European standard EN 954-1 defines four safety categories, with category 4 imposing the highest safety requirements in terms of intrinsic failsafety of the safety switching apparatus. Apparatuses which comply with category 4 are usually designed with multichannel redundancy. In such a case, the signals must also be in multichannel-redundant form, i.e. they must include at least a first and a second signal having a correlated information content.

In addition, category 4 requires the safety switching apparatus to identify a short on the signal lines which transmit these signals, because a short means that single-fault safety is lost. For applications below category 4, however, it is possible to dispense with short-circuit identification, which simplifies the wiring of the safety switching apparatus and makes installation less expensive.

A prior art safety switching apparatus is sold by the assignee under the brand name PNOZ X8P. This prior art safety switching apparatus can be used either with or without short-circuit identification, with the wiring connection of the signal lines for supplying these signals being different in the two cases. For an application with short-circuit identification, the second channel of the signaling device (which produces the second signal) has to be connected to different terminals than for an application without short-circuit identification. To allow flexible use, the known safety switching apparatus therefore requires a relatively large number of connection terminals.

German Patent Publication DE 44 23 704 C1 discloses a safety switching apparatus wherein a first signal is supplied to the control circuit of a first switching element via a first terminal, while a second signal is routed to the control circuit of a second switching element via a second terminal. Due to the fact that the control circuits of the two switching elements are further connected to a common ground potential and the signals have a positive and a negative signal level relative to the common ground potential, it is possible to identify a short between the two signals. However, this prior art safety switching apparatus does not allow operation without short-circuit identification, and it is therefore limited in terms of the flexibility of use. Furthermore, this known safety switching apparatus requires an AC supply, which also restricts the opportunities for use.

SUMMARY OF THE INVENTION

Against this background, it is an object of the present invention to provide a safety switching apparatus of the type mentioned at the outset, which offers flexible options for use and can be accommodated in a compact and small installation space.

According to one aspect of the invention, there is provided a safety switching apparatus for failsafe shut-down of an automatically operated installation in response to a first and a second signal from a two-channel signaling device, with the first and the second signal each having a defined polarity, the safety switching apparatus comprising a first terminal for supplying the first signal and a second terminal for supplying the second signal, a first and a second switching element, which together are designed to produce a redundant output switching signal for shutting-down the installation, and circuitry having a first current path, an alternative second current path and at least one further switching element, wherein the first switching element has a first control circuit to which the first signal is supplied, wherein the second switching element has a second control circuit to which the second signal is supplied, and wherein the at least one further switching element is designed to automatically route the second signal to the second control circuit either via the first current path or via the second current path, depending on the polarity of the second signal relative to the polarity of the first signal.

According to another aspect of the invention, there is provided a safety switching apparatus for failsafe disconnection of an electrical load, comprising a first and a second terminal for supplying a first and a second signal, comprising a first and a second switching element, which together are designed to produce a redundant output switching signal for disconnecting the load, and circuitry having a first current path, an alternative second current path and at least one further switching element, wherein the first switching element has a first control circuit to which the first signal is supplied, wherein the second switching element has a second control circuit to which the second signal is supplied, and wherein the at least one further switching element is designed to connect either the first or the second current path, depending a polarity of the second signal, in order to route the second signal to the second control circuit.

Embodiments of the novel safety switching apparatus thus have at least two alternative current paths which are preferably arranged at least partially between the second terminal and the second control circuit. This allows the signal at the second terminal to be routed to the second control circuit differently. Since the selection between the at least two alternative current paths is dependent on the polarity of the signal at the second terminal, the safety switching apparatus is able to process signals of different polarities at the second terminal. In other words, signals of different polarities may be supplied on the second terminal. Depending on the polarity used, wiring with or without short-circuit identification is possible, although the signals can be supplied via the same connection terminals in both cases."

Consequently, the novel safety switching apparatus can be implemented with a smaller number of connection terminals than the assignee's PNOZ X8P safety switching apparatus mentioned above. Accordingly, it can also be implemented in a smaller device housing, because the number of required connection terminals affects the physical size. The terminal-saving implementation of the novel safety switching apparatus therefore allows the installation space to be reduced without limiting the flexibility of use. Therefore, the above object is completely achieved.

In addition, the novel safety switching apparatus allows a very simple and inexpensive implementation because the signals can be directly used for activating or deactivating the switching elements. In other words, the signals from the signaling devices can supply the power for turning the switching elements on and/or off, which is actually preferred in exemplary embodiments of the invention. Therefore, loss of a signal from a signaling device automatically results in the associated switching element being turned off and hence in the electrical load being disconnected.

The novel safety switching apparatus can therefore be implemented very inexpensively, and it is particularly suitable for "small" applications in which only a few safety functions need to be monitored.

In a preferred refinement, the at least one further switching element comprises a plurality of diodes which form a bridge rectifier.

This refinement is a very inexpensive way of supplying power to the second control circuit regardless of the polarity of the signal. Furthermore, this refinement allows a reduction in the number of the required components, since polarized components, such as electrolytic capacitors or optocouplers which are often required for supplying power to and monitoring the second control circuit, each need to be provided only once.

In a further refinement, the bridge rectifier has a first and a second bridge terminal, the second control circuit being arranged between them.

In this refinement, the second control circuit is arranged in the bridge path of the bridge rectifier. This refinement allows a very simple and inexpensive implementation.

In a further refinement, the bridge rectifier has a third and a fourth bridge terminal, wherein the third bridge terminal is coupled to the second terminal and wherein the fourth terminal is connected to a defined reference potential. In this case, the reference potential may be a fixed or variable reference potential, such as a switchable potential.

This refinement provides for a defined flow of current through the bridge rectifier depending on the signal at the second terminal of the safety switching apparatus. Depending on the polarity of the second signal, different current paths are conductive within the bridge rectifier, with these current paths being switched by the switching elements (diodes) in the bridge rectifier. In addition, this refinement also provides at least a coarse monitoring of the signal level of the second signal, because a sufficient flow of current through the paths of the bridge rectifier is possible only if a defined potential difference exists between the reference potential and the second signal. This refinement is therefore a simple and inexpensive implementation which affords additional safety.

In a further refinement, the second signal alternates between a high first and a low second signal level, wherein the defined reference potential is substantially in the mid between the first and second signal levels. In this refinement, one of the signal levels may also be a high-impedance, unused state at the second terminal.

This refinement provides a simple way of automatically operating the novel safety switching apparatus with two signals of different polarity. It is sufficient for the user (for example an installer wiring up the novel safety switching apparatus in a machine or installation) to connect the signal line which transmits the second signal to the second terminal. The novel safety switching apparatus of this refinement can be started up without further adjustments to the mode of operation (with or without short-circuit identification). This refinement is therefore very convenient for the user.

In a further refinement, the circuitry comprises at least one switch is designed to connect the second control circuit either to a first or to a second reference potential. Preferably, the first and second reference potentials are fixed potentials. In a particularly preferred embodiment, the first reference potential is a DC operating voltage and the second reference potential is ground.

In addition, it is preferred if the circuitry has at least two switches, preferably in the form of transistors, in a half-bridge arrangement, which switches are arranged between the internal operating voltage of the safety switching apparatus and ground.

These refinements are particularly preferred if the signals also alternate between operating voltage and ground, with the operating voltage signaling the safe state. By connecting the second control circuit either (depending on the polarity of the second signal) to the first or to the second operating potential, the control circuit can be operated in the same way in each case, regardless of the polarity of the second signal. The control circuit can operate independently of the selected mode of operation, and it is provided with maximum switching power in each case, which ensures very reliable operation of the novel safety switching apparatus. In addition, this refinement requires few internal potentials, which facilitates a failsafe design.

In a further refinement, the novel safety switching apparatus comprises a control unit which is designed to connect the second control circuit alternately to the first or to the second reference potential until a flow of current is detected in the second control circuit.

In this refinement, the novel safety switching apparatus can also automatically adjust itself to the signal at the second terminal, since a flow of current in the second control circuit indicates that the relevant switching position of the second further switching element is the "correct" switching position for evaluating the applied second signal. Therefore, this refinement is also a very convenient solution for the user which simplifies installation of the novel safety switching apparatus.

Preferably, this refinement also comprises a current detector which is connected to the second control circuit in order to detect the flow of current in the second control circuit, with the current detector then being coupled to the control unit.

In a further refinement, the novel safety switching apparatus comprises an enabling unit which is designed to disable the control unit as soon as a flow of current is detected in the second control circuit.

This refinement allows the first and second switching elements to be used as "fault memory", since the switching position of the second switching element cannot be changed again by the control unit once a current flow is detected in the second control circuit. Hence, this refinement facilitates the design of particularly simple and inexpensive safety switching apparatuses.

In a further refinement, the safety switching apparatus comprises a control element having at least two control positions, wherein the control element is operationally coupled to the at least one switch in order to connect the second control circuit either to the first or to the second reference potential. Preferably, the control element is designed to be manually operated.

In this refinement, the user has the option of selectively setting the "type" of the second signal. This refinement therefore dispenses with the advantage of the variants discussed above wherein the safety switching apparatus identifies the type of the second signal automatically. On the other hand, the present refinement has the advantage that both single-pole and two-pole signals can be correctly processed. A single-pole signal is a signal which alternates between a defined potential and a high-impedance state. Typically, single-pole signals are produced by contact-based signaling devices, such as emergency-off buttons. Two-pole signals alternate between a high and a low potential, for example between 24 V and 0 V (ground). Such signals are typically supplied by light barriers and other signaling devices with semiconductor outputs. The present refinement increases the flexibility of the novel safety switching apparatus. This reduces production and storage costs.

In a further refinement, at least the second switching element is an electromechanical switching element, preferably an unpolarized electromechanical switching element, and even more preferred a relay having a plurality of make contacts which are positively guided.

This refinement is advantageous because an electromechanical switching element provides a floating output switching signal for disconnecting the load. An output switching signal of this kind can be used in a plurality of environments, which means that the scope of application of the novel safety switching apparatus is increased. An unpolarized electromechanical switching element is advantageous because a control current can effectively flow in both directions. This refinement facilitates practical implementation.

It goes without saying that the features which have been mentioned above and those which are yet to be explained below can be used not only in the respectively specified combination but also in other combinations or on their own without departing from the scope of the present invention.

BRIEF DESCRIPTION OF THE DRAWINGS

Exemplary embodiments of the invention will be explained in more detail in the description which follows and are illustrated in the drawing, in which.

DESCRIPTION OF PREFERRED EMBODIMENTS

Figure 1:
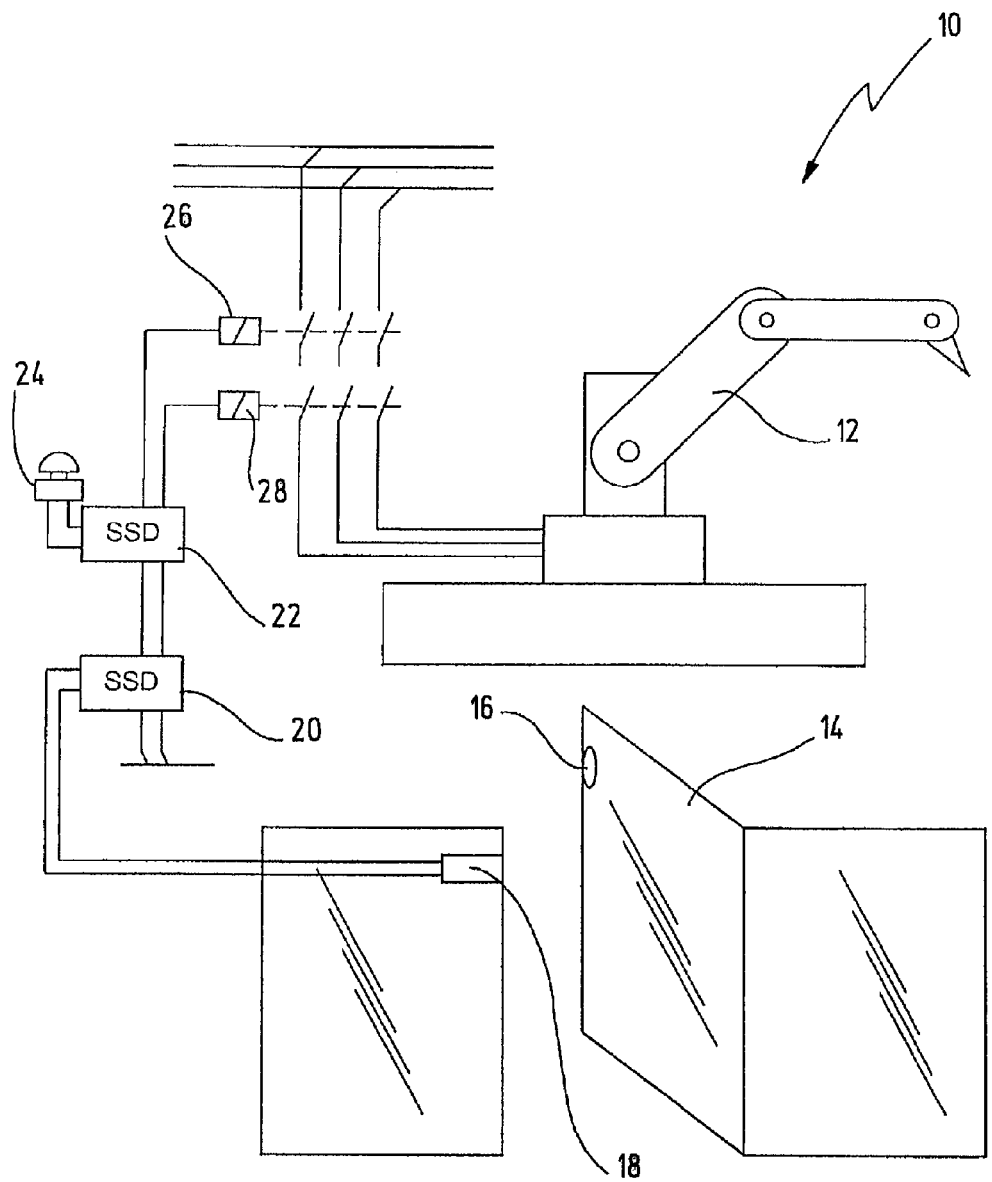
FIG. 1 shows a schematic illustration of an automatically operated installation wherein exemplary embodiments of the novel safety switching apparatus are used.

In FIG. 1, an installation where exemplary embodiments of the invention are used is denoted by the reference numeral 10 in its entirety.

The installation 10 comprises a robot 12 whose operating space is protected by means of a guard door 14. An actuator 16 is arranged on the guard door 14, which actuator interacts with a guard door switch 18. Guard door switch 18 is seated on a frame on which the moving part of guard door 14 rests in the closed state. By way of example, actuator 16 may be a transponder which can communicate with the guard door switch 18 only when guard door 14 is closed.

The guard door switch 18 is connected to a safety switching device 20 which processes the signals from the guard door switch 18. There is a second safety switching device 22 arranged in series with safety switching device 20, with an emergency-off button 24 being connected as a signaling device to the second safety switching device 22. The safety switching devices 20, 22 are compact safety switching apparatuses in terms of the present invention, and they have a predefined scope of functions implemented by the manufacturer. In principle, however, the invention may also be used for more complex, programmable safety controllers.

Reference numerals 26, 28 denote two contactors whose make contacts are arranged in the power supply path to the robot 12. The control circuits of contactors 26, 28 are supplied with power via the safety switching devices 20, 22, so that each of the safety switching devices 20, 22 is able to disconnect the robot 12 via contactors 26, 28. An operational controller controlling the normal operations of robot 12 is not shown for the sake of simplicity.

Figure 2:
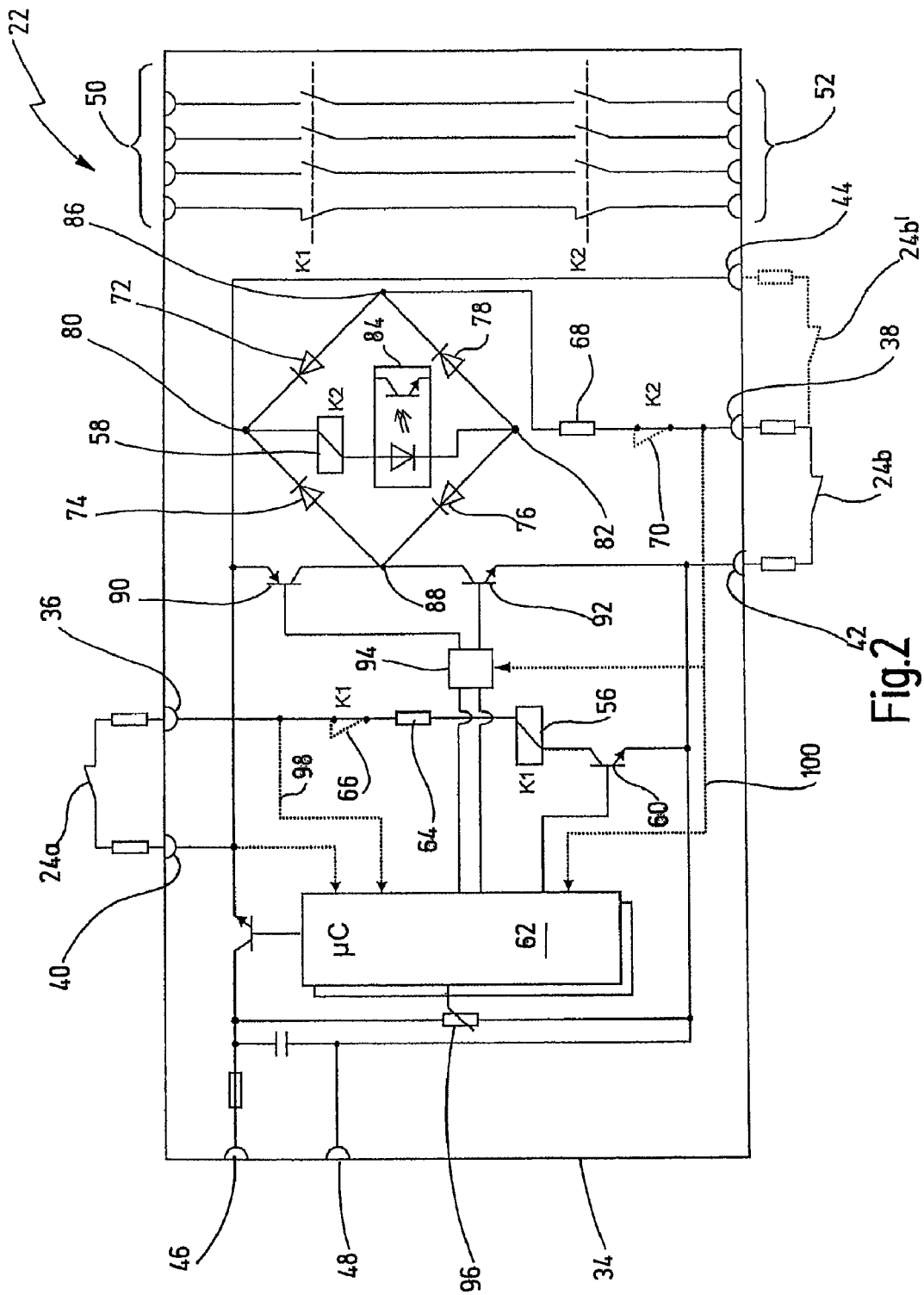
FIG. 2 shows a simplified illustration of an exemplary embodiment of the novel safety switching apparatus.

FIG. 2 shows a preferred exemplary embodiment of the invention with respect to safety switching device 22. Same reference symbols denote the same elements as before.

Safety switching device 22 has a device housing 34 including a plurality of device or connection terminals for connecting the emergency-off button 24, the contactors 26, 28 and possible further signaling devices and actuators (not shown here). Reference symbol 36 denotes a first connection terminal, to which a first break contact 24a of the emergency-off button 24 is connected. Reference numeral 38 denotes a second terminal, to which a second break contact 24b of emergency-off button 24 is connected. The safety switching apparatus 22 thus receives a first signal, which is dependent on the switching position of the signaling contact 24a, via terminal 36 and receives a second signal, which is dependent on the switching position of the signaling contact 24b, via terminal 38.

In the embodiment shown here, break contact 24a is also connected to a terminal 40, which carries an operating voltage $U_B$ of 24 V, for example, from inside of the device. When break contact 24a is closed, the terminal 36 therefore receives the operating voltage $U_B$ as a signal. When signaling contact 24a is open (not shown here), terminal 36 "sees" a high impedance state.

In this exemplary embodiment, break contact 24b is likewise connected to a terminal 42 which is grounded from inside of the device. Accordingly, the terminal 38 is connected to the device ground when the break contact 24b is closed. When the break contact 24b is open, the terminal 38 is likewise at a high impedance state.

Provision of the signals, which are routed via break contacts 24a, 24b, on output terminals 40, 42 of the device is a typical implementation for safety switching devices of the this type. However, the invention is not limited to this implementation. Rather, the terminals 36, 38 may also receive signals which are produced externally using another devices, for example using a light barrier (not shown here). In this case, the terminals 40, 42 may remain unused.

In the variant shown, the safety switching device 22 can identify a short between the signaling lines to the emergency-off button, because the signal at terminal 36 corresponds to the operating voltage $U_B$ in the safe state, while the signal at the second terminal 38 corresponds to the ground potential in the safe state. A short between the signal lines carrying the signals would result in the potential at the first terminal 36 being pulled to ground, which is detected in a manner described below.

Alternatively, the safety switching apparatus 22 can also be operated without short-circuit identification on the signaling lines, if this is acceptable in accordance with a lower safety category. In this case, the second signaling contact 24b of the emergency-off button 24 would be connected to a terminal 44, as shown in a dotted line by the reference numeral 24b'. Terminal 44 is connected to the operating voltage $U_B$ from inside of the device, so that both signaling contacts 24a, 24b' would then carry the operating voltage $U_B$ in the safe state. Short-circuit identification is not possible in this case.

As an alternative to this illustration, the second signaling contact 24b' could also be arranged between the terminals 38 and 40, i.e. the input-side connections of the signaling contacts 24a, 24b' would be connected in parallel at the terminal 40. This implementation allows terminal 44 to be dispensed with in order to save further installation space.

Two further terminals 46, 48 serve for supplying the safety switching device 22 with the operating voltage $U_B$ of 24 V by way of example. Further terminals 50, 52 are provided for connecting the contactors 26, 28 and possible further loads.

In the exemplary embodiment shown, the safety switching device 22 has floating outputs in the form of relay contacts, which are connected in series with one another between the terminals 50, 52. In such a case, terminals 50 may be connected to a positive potential of 24 V, for example, and the contactors 26, 28 may be connected to terminals 52. The relay contacts of relays K1, K2 can then be used to supply the contactors 26, 28 with current, or to interrupt the flow of current. Alternatively or in addition, the present invention can also be used for safety switching apparatuses which have semiconductor outputs related to a specific potential, however.

Relays K1, K2 each have a control circuit, which is denoted by the reference numerals 56, 58 in FIG. 2. In this case, the control circuits 56, 58 are the energizing coils of respective relays K1, K2. As shown in FIG. 2, the control circuit (energizing coil) 56 of relay K1 has one terminal connected to ground, with this path also containing a collector-emitter path of a transistor 60, which a microcontroller 62 can use to interrupt the flow of current through energizing coil 56. The second terminal of control circuit 56 is routed via a resistor 64 and a make contact 66 of relay K1 to the terminal 36. Resistor 64 is a symbolic equivalent resistance which is representative of further components and line resistances which are not shown here for sake of simplicity. The make contact 66 implements self-latching for relay K1, which has been used for many years in safety switching devices of the present type and is therefore known to the skilled person.

In summary, the signal from terminal 36 is thus routed via control circuit 56 of relay K1 and it delivers the power for latching relay K1. (In order to energize relay K1, the power may be supplied via a starting circuit, which is not shown here for sake of simplicity.) If the signal at terminal 36 corresponds to the operating voltage $U_B$ and relay K1 is in a self-latched state (make contact 66 closed), a control current flows through the energizing coil of relay K1 and the operating contacts of relay K1 are closed (not shown).

Likewise, control circuit 58 of relay K2 is connected to the second terminal 38 via a symbolic equivalent resistance 68 and a make contact 70 (for self-latching). However, control circuit 58 of relay K2—unlike control circuit 56 of the relay K1—is located in a diode bridge in this exemplary embodiment, which diode bridge comprises four diodes 72, 74, 76, 78 in a bridge circuit. The diode bridge has a first and a second bridge terminal 80, 82, between which the control circuit 58 of relay K2 and an optocoupler 84 are arranged. In this case, optocoupler 84 is used as a current detector, which microcontroller 62 can use to determine whether or not a current is flowing in the bridge path between bridge connections 80, 82. Instead of an optocoupler, it would also be possible to use another element for current detection, such as a shunt resistor or Hall element.

In addition, the diode bridge has a third and a fourth bridge terminal 86, 88. The third bridge terminal 86 is connected to terminal 38 via resistor 68 and the make contact 70. (Alternatively, the resistor 68 and the make contact 70 could also be arranged in the bridge path of the diode bridge.) The fourth bridge terminal 88 is connected to the collector of a pnp transistor 90 and to the collector of an npn transistor 92. Transistors 90, 92 form a half-bridge which is arranged between the operating voltage $U_B$ and ground. Accordingly, the emitter of the pnp transistor 90 is connected to the operating voltage $U_B$ and the emitter of the npn transistor 92 is connected to ground. The control connections (bases) of the transistors 90, 92 are coupled to the microcontroller 62 via an enabling unit 94.

The diode bridge provides a first and an alternative second current path to the control circuit 58 of relay K2. If the second signal at terminal 38, as shown in FIG. 2, corresponds to the ground potential and if also pnp transistor 90 is on and npn transistor 92 is off, the diodes 74, 78 are forward-biased and a flow of current is enabled via pnp transistor 90, the fourth bridge terminal 88, the diode 74, the control circuit 58 of relay K2, the optocoupler 84, the diode 78, the bridge terminal 86, the resistor 68, the make contact 70 and the signaling contact 24b to ground.

By contrast, if the signaling contact 24b' is connected up to the operating voltage $U_B$, and if also the transistor 90 is off and the transistor 92 is on, a flow of current is enabled via the signaling contact 24b', the make contact 70, the resistor 68, the diode 72, the control circuit 58 of relay K2, the optocoupler 84, the diode 76 and the transistor 92. In both cases, a control current flows through control circuit 58, which control current results in the make contacts of relay K2 being able to close.

The diodes 72, 74, 76, 78 are therefore switching elements which form different current paths to the control circuit 58 of relay K2 depending on the polarity of the signal at terminal 38. In addition, the transistors 90, 92 are switching elements which the microcontroller 62 can use to activate and deactivate the different current paths in a selective manner.

Reference numeral 96 denotes a potentiometer as an example of a manually actuatable control element. Potentiometer 96 has one terminal connected to the operating voltage $U_B$ and a second terminal connected to ground. The potentiometer's tap is supplied to the microcontroller 62. Instead of a potentiometer, it would also be possible to use a rotary switch, DIP switch or another manually actuatable control element here. Microcontroller 62 can identify the mode of operation in which the safety switching device 22 is intended to operate from the control position of control element 96.

In the present embodiment, microcontroller 62 particularly identifies whether the safety switching device 22 is intended to operate with or without short-circuit identification between the signal lines at the terminals 36, 38. If the potentiometer 96 has been used to select a mode of operation with short-circuit identification, the microcontroller 62 turns on pnp transistor 90 and turns off npn transistor 92. This means that the bridge terminal 88 is connected to operating voltage $U_B$, and a flow of current is produced through the bridge path and via the control circuit 58 of relay K2 when a ground potential is applied to the second terminal 38 (additionally, an operating voltage potential must also be applied to the first terminal 36 so that relay K2 can energize, but this is not shown in more detail here for sake of simplicity). By contrast, if potentiometer 96 is used to select an alternative mode of operation which operates without short-circuit identification on the signal lines, microcontroller 62 turns off pnp transistor 90 and turns on npn transistor 92. In this case, terminal 38 must have an operating voltage potential applied to it so that a control current can flow through the bridge path and via control circuit 58 of relay K2.

In the exemplary embodiment shown here, short-circuit identification between the signal lines at terminals 36, 38 is implemented by means of microcontroller 62 recording the potentials at the two terminals 36, 38 by measurement, which is shown in a simplified fashion by means of two measuring lines 98, 100. In a preferred embodiment, microcontroller 62 has integrated A/D converters for recording the potentials at terminals 36, 38 via measuring lines 98, 100. A plausibility comparison for the potentials allows a short to be identified. This type of short-circuit identification is the subject matter of earlier German patent application DE 10 2005 055 325.7-32 of the present applicant, which is incorporated by reference here for the purposes of further explanation.

Alternatively, the short-circuit identification may also be implemented in a conventional manner, such as in the case of the safety switching device PNOZ X8P mentioned at the outset.

In the exemplary embodiment shown in FIG. 2, the potential tapped at terminal 38 is also supplied to the enabling unit 94. The operation of the enabling unit 94 is explained in more detail further below with reference to FIG. 4. In other exemplary embodiments, enabling unit 94 may be dispensed with.

Finally, a preferred embodiment of the novel safety switching device 22 comprises a single-channel microcontroller 62. Alternatively, however, it is also possible to use two or more redundant microcontrollers 62, as shown in FIG. 2 in simplified form. Furthermore, instead of microcontroller 62, it is also possible to use other logic chips, such as an FPGA or an ASIC, or the safety switching device can be constructed entirely from discrete components using the present invention.

Figure 3:
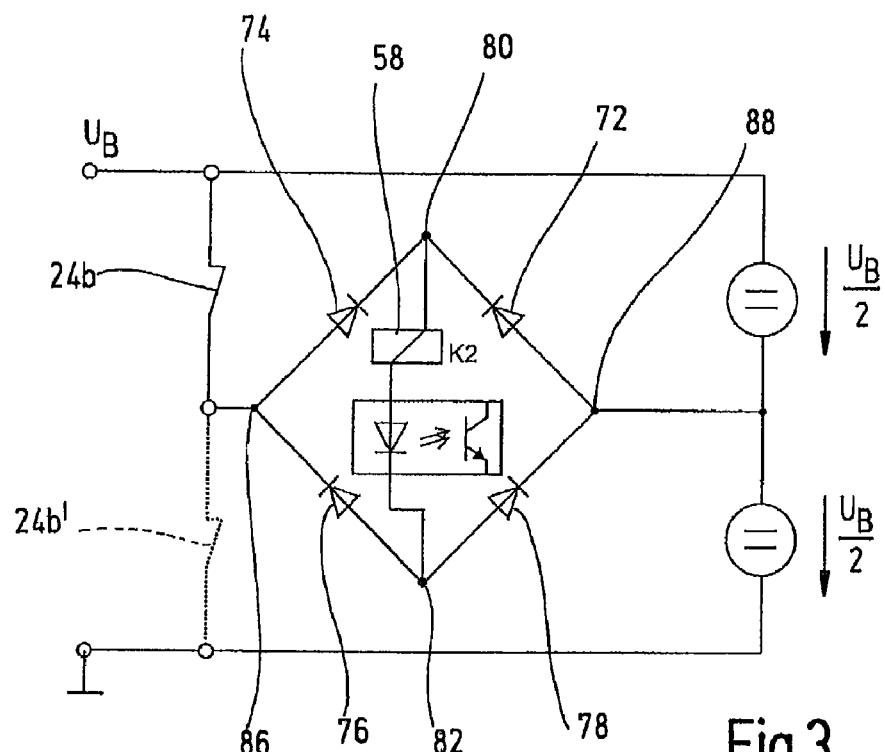
FIG. 3 shows a simplified equivalent circuit diagram including the second switching element in accordance with a further exemplary embodiment.

FIG. 3 shows a modification of the embodiment of FIG. 2 in a simplified equivalent circuit diagram which essentially shows the bridge rectifier including the second control circuit and the alternative terminal options for the second signaling contact 24b/24b'. Aside from that, same reference symbols denote the same elements as before.

In the modification shown in FIG. 3, the signaling contact 24b or 24b' is again connected between bridge terminal 86 of the diode bridge, and, selectively, either operating voltage $U_B$ or ground. In this case, however, the opposite bridge terminal 88 is connected to a potential which corresponds to half the operating voltage $U_B$. This implementation allows transistors 90, 92 to be dispensed with.

Since half the operating voltage $U_B/2$ is always present across the bridge path between the bridge connections 80, 82, a control current can flow via control circuit 58 of the relay K2 in both alternatives without the need for manual changeover. Only the diodes 72 to 78 connect the different current paths depending on the wiring or the potential at bridge terminal 86, with any changeover taking place automatically. This variant of the invention therefore provides automatic identification of the respective type of wiring chosen.

Figure 4:
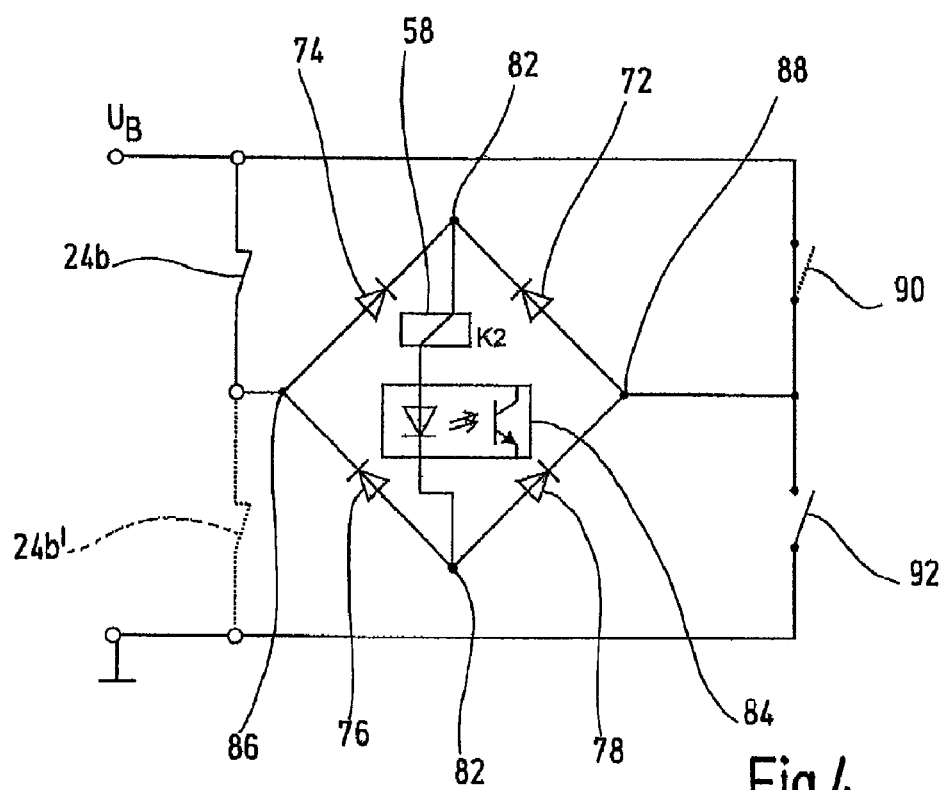
FIG. 4 shows a simplified equivalent circuit diagram of a further exemplary embodiment.

FIG. 4 shows another variant which allows automatic identification of the type of wiring. Again, same reference symbols denote the same elements as before. The internal wiring of this variant corresponds to the solution shown in FIG. 2 including the two transistors 90, 92. If microcontroller 62 now toggles the two transistors 90, 92 on and off, bridge terminal 88 has operating voltage $U_B$ or ground applied to it alternately. If the signaling contact 24b/24b' is now connected to bridge terminal 86, a control current flows through the bridge path and via the optocoupler 84 as soon as the bridge connections 86, 88 are at different potentials. Microcontroller 62 can identify the flow of current using optocoupler 84, and it then maintains the latest switching position of transistors 90, 92.

To prevent microcontroller 62 from restarting the "search" for kind of wiring of the signaling contact 24b/24' once the connected signaling contact is opened, enabling unit 94 (FIG. 2) is provided. This is in the form of a self-latching mechanism such that it prevents microcontroller 62 from accessing transistors 90, 92 after a defined potential is identified at bridge terminal 86 and/or a flow of current is identified in the bridge path. The enabling unit 94 does not allow microcontroller 62 to access transistors 90, 92 again until the safety switching device 22 is restarted following discontinuation of the operating voltage $U_B$ at terminal 46.

In another exemplary embodiment (not shown here), the potential at bridge terminal 88 can be changed over manually in order to selectively change between the alternative current paths of the bridge rectifier.

What is claimed is:

1. A safety switching apparatus for failsafe shut-down of an automatically operated installation in response to a first signal and a second signal from a two-channel signaling device, with the first and the second signals each having a defined polarity, the safety switching apparatus comprising:
   a first terminal for supplying the first signal and a second terminal for supplying the second signal,
   a first and a second switching element, which together produce a redundant output switching signal for shutting-down the installation,
   a first circuit connecting said first terminal and said first switching element for supplying said first signal to said first switching element, and
   a second circuit connecting said second terminal and said second switching element for supplying said second signal to said second switching element,
   wherein said second circuit includes a first current path comprising a first pair of diodes from a bridge rectifier, a second current path comprising a second pair of diodes from said bridge rectifier and at least one further active switching element, and further
   wherein the at least one further active switching element selectively routes the second signal to said second switching element either via the first current path or via the second current path, depending upon the polarity of said second signal, such that said first and second switching elements produce said redundant output switching signal whenever current flows simultaneously through said first switching element via said first circuit and through said second switching element via either of said first and second current paths in said second circuit.

2. The safety switching apparatus of claim 1, wherein the bridge rectifier has a first and a second bridge terminal, with the second switching element being arranged between the first and second bridge terminal.

3. The safety switching apparatus of claim 2, wherein the bridge rectifier has a third and a fourth bridge terminal, with the third bridge terminal being coupled to the second terminal, and with the fourth bridge terminal being connected to a defined reference potential.

4. The safety switching apparatus of claim 3, wherein the second signal changes between a high signal level and a low signal level, with the defined reference potential being substantially in the middle of the range between the high and low signal levels.

5. The safety switching apparatus of claim 3, wherein the at least one further active switching element comprises at least one switching transistor that selectively connects the fourth bridge terminal to one of two different reference potentials.

6. The safety switching apparatus of claim 5, wherein the second circuit further comprising a control unit that toggles the at least one switching transistor in order to alternately connect the fourth bridge terminal to one of the two different reference potentials until a flow of current is detected in the second switching element.

7. The safety switching apparatus of claim 6, wherein the second circuit further comprising an enabling unit that disables the control unit as soon as a flow of current is detected in the second switching element.

8. The safety switching apparatus of claim 6, wherein the control unit further determines the polarity of the second signal based upon which of the first and second current paths routes current to the second switching element when current flow in the second switching element is detected.

9. The safety switching apparatus of claim 5, wherein the second circuit further comprising a control element having at least two control positions, wherein the control element is operationally coupled to the at least one switching transistor in order to select one of the two different reference potentials.

10. The safety switching apparatus of claim 1, wherein the second switching element is an electromechanical switching element.

11. The safety switching apparatus of claim 1, wherein the first switching element is an electromechanical switching element.

12. A safety switching apparatus for failsafe shut-down of an automatically operated installation in response to a first signal and a second signal from a two-channel signaling device, with the first and the second signals each having a defined polarity, the safety switching apparatus comprising:
a first terminal for supplying the first signal and a second terminal for supplying the second signal,
a first and a second switching element, which together produce a redundant output switching signal for shutting-down the installation,
a first circuit connecting said first terminal and said first switching element for supplying said first signal to said first switching element, and
a second circuit connecting said second terminal and said second switching element for supplying said second signal to said second switching element,
wherein said second circuit includes a first current path and a second current path and at least one further active switching element connected between a fixed operating voltage ($U_B$) and ground and to said first and second current paths, and further
wherein the at least one further active switching element selectively routes the second signal to said second switching element via the first current path when the second signal is of a first polarity and via the second current path when the second signal is of a second polarity.

13. The safety switching apparatus of claim 12, wherein said second circuit comprises a plurality of diodes forming a bridge rectifier.

14. The safety switching apparatus of claim 13, wherein the bridge rectifier has a first and a second bridge terminal, with the second switching element being arranged between the first and second bridge terminal.

15. The safety switching apparatus of claim 14, wherein the bridge rectifier has a third and a fourth bridge terminal, with the third bridge terminal being coupled to the second terminal, and with the fourth bridge terminal being connected to a defined reference potential.

16. The safety switching apparatus of claim 15, wherein the second signal changes between a high signal level and a low signal level, with the defined reference potential being substantially in the middle of the range between the high and low signal levels.

17. The safety switching apparatus of claim 16, wherein the at least one further active switching element comprises at least one switching transistor that selectively connects the fourth bridge terminal to one of two different reference potentials.

18. The safety switching apparatus of claim 17, wherein the second circuit further comprising a control unit that toggles the at least one switching transistor in order to alternately connect the fourth bridge terminal to one of the two different reference potentials until a flow of current is detected in the second switching element.

19. The safety switching apparatus of claim 18, wherein the second circuit further comprising an enabling unit that disables the control unit as soon as a flow of current is detected in the second switching element.

20. The safety switching apparatus of claim 18 wherein the control unit further determines the polarity of the second signal based upon which of the first and second current paths routes current to the second switching element when current flow in the second switching element is detected.

21. The safety switching apparatus of claim 17, wherein the second circuit further comprising a control element having at least two control positions, wherein the control element is operationally coupled to the at least one switching transistor in order to select one of the two different reference potentials.

22. The safety switching apparatus of claim 12, wherein the second switching element is an electromechanical switching element.

23. The safety switching apparatus of claim 12, wherein the first switching element is an electromechanical switching element.

24. A safety switching apparatus for failsafe shut-down of an automatically operated installation in response to a first signal and a second signal from a two-channel signaling device, with the first and the second signals each having a defined polarity, the safety switching apparatus comprising:
a first terminal for supplying the first signal and a second terminal for supplying the second signal,
a first and a second switching element, which together produce a redundant output switching signal for shutting-down the installation,
a first circuit connecting said first terminal and said first switching element for supplying said first signal to said first switching element, and
a second circuit connecting said second terminal and said second switching element for supplying said second signal to said second switching element,
wherein said second circuit includes a first current path and a second current path and at least one further active switching element, and further
wherein the at least one further active switching element has a first switch state for activating the first current path so that the second signal is routed to said second switching element via the first current path and a second switch state for activating the second current path so that the second signal is routed to said second switching element via the second current path, and wherein the second circuit further includes a control unit connected to said at least one further active switching element for selectively controlling the switch state of said at least one further active switching element.

25. The safety switching apparatus of claim 24, wherein said second control circuit comprises a plurality of diodes forming a bridge rectifier with the bridge rectifier having a first and a second bridge terminal, with the second switching element being arranged between the first and second bridge terminal, and a third and a fourth bridge terminal, with the third bridge terminal being coupled to the second terminal, and with the fourth bridge terminal being connected to a defined reference potential.

26. The safety switching apparatus of claim 25 wherein the control unit further determines the polarity of the second signal based upon which of the first and second current paths is activated when current flow is detected in the second switching element.

27. The safety switching apparatus of claim 26, wherein the at least one further active switching element comprises at least one switching transistor that selectively connects the fourth bridge terminal to one of two different reference potentials, and further wherein the control unit toggles the at least one switching transistor in order to alternately connect the fourth bridge terminal to one of the two different reference potentials until a flow of current is detected in the second switching element.

28. A safety switching apparatus for failsafe shut-down of an automatically operated installation in response to a first signal and a second signal from a two-channel signaling device, with the first and the second signals each having a defined polarity, the safety switching apparatus comprising:

a first terminal for supplying the first signal and a second terminal for supplying the second signal, a first and a second switching element, which together produce a redundant output switching signal for shutting-down the installation, a first circuit connecting said first terminal and said first switching element for supplying said first signal to said first switching element, and a second circuit connecting said second terminal and said second switching element for supplying said second signal to said second switching element, wherein said second control circuit comprises a plurality of diodes forming a bridge rectifier, the bridge rectifier having a first and a second bridge terminal, with the second switching element being arranged between the first and second bridge terminal, and a third and a fourth bridge terminal, with the third bridge terminal being coupled to the second terminal, and with the fourth bridge terminal being connected to a defined reference potential, and further wherein the second signal changes between a high signal level and a low signal level, and the defined reference potential is substantially in the middle of the range between the high and low signal levels.

* * * * *